United States Patent
Grimm

(10) Patent No.: US 10,962,575 B2
(45) Date of Patent: Mar. 30, 2021

(54) MULTI-DOMAIN MEASUREMENT SYSTEM AS WELL AS USE OF A MULTI-DOMAIN MEASUREMENT SYSTEM

(71) Applicant: Rohde & Schwarz GmbH & Co. KG, Munich (DE)

(72) Inventor: Michael Grimm, Anzing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 515 days.

(21) Appl. No.: 15/687,389

(22) Filed: Aug. 25, 2017

(65) Prior Publication Data

US 2019/0064233 A1 Feb. 28, 2019

(51) Int. Cl.
| | | |
|---|---|---|
| G01R 21/133 | (2006.01) | |
| G01R 13/02 | (2006.01) | |
| G01R 21/06 | (2006.01) | |
| G01R 13/20 | (2006.01) | |

(52) U.S. Cl.
CPC ....... *G01R 21/133* (2013.01); *G01R 13/0218* (2013.01); *G01R 13/20* (2013.01); *G01R 21/06* (2013.01)

(58) Field of Classification Search
CPC .................................................. G01R 21/133
See application file for complete search history.

(56) References Cited

U.S. PATENT DOCUMENTS

| | | | |
|---|---|---|---|
| 2008/0033681 A1* | 2/2008 | Ziomek et al. | |
| 2010/0007329 A1* | 1/2010 | Kuhwald | G01R 13/0254 324/76.43 |
| 2010/0057388 A1* | 3/2010 | LeBrun | H04L 12/403 702/67 |
| 2011/0066402 A1 | 3/2011 | Dobyns | |
| 2011/0115470 A1* | 5/2011 | Cox et al. | |
| 2012/0038369 A1* | 2/2012 | Dobyns et al. | |
| 2012/0039374 A1* | 2/2012 | Dobyns | |
| 2012/0041701 A1* | 2/2012 | Hillman, Jr. et al. | |
| 2012/0197598 A1* | 2/2012 | Dobyns et al. | |
| 2016/0099784 A1* | 4/2016 | Bratfisch et al. | |

OTHER PUBLICATIONS

TEKTRONIX, 5 Series MSO Mixed Signal Oscilloscope Datasheet, May 25, 2017 (Year: 2017).*
Measurement Technology Press Release dated Mar. 16, 2017, located at https://www.rohde-schwarz.com/de/news-und-presse, last visited on Mar. 30, 2017, 3 pgs.—including Machine translation of Press Release.

* cited by examiner

*Primary Examiner* — Raymond L Nimox
(74) *Attorney, Agent, or Firm* — Schwabe, Williamson & Wyatt, P.C.

(57) ABSTRACT

A Multi-Domain Measurement System has an oscilloscope unit and a power probe unit. The oscilloscope unit comprises an analog input channel for receiving a measured analog signal and a first digital interface for receiving digitized measurement values from said power probe unit. The power probe unit is connected to the first digital interface for providing digitized measurements of a power supply signal. The power probe unit and the analog input channel are assigned to a device under test for simultaneously measuring signals in different domains. The power probe unit has a power probe measurement channel providing a vertical digitizing resolution that is at least two times higher than a vertical digitizing resolution of the analog input channel.
Further, uses of a Multi-Domain Measurement System are provided.

19 Claims, 1 Drawing Sheet

MULTI-DOMAIN MEASUREMENT SYSTEM AS WELL AS USE OF A MULTI-DOMAIN MEASUREMENT SYSTEM

FIELD OF THE DISCLOSURE

The disclosure relates to a Multi-Domain Measurement System as well as a use for a Multi-Domain Measurement System.

BACKGROUND

The power consumption of radio frequency modules and chip sets, especially of battery-powered modules and chip sets, is a critical design feature that directly influences the usability. To improve the usability, the power consumption of the device has to be reduced as much as possible.

For optimization and debugging of the power consumption during the design process of the radio frequency module or chip set, the power consumption has to be correlated with analog radio frequency signals and digital outputs of the module or chip set.

However, power supply signals for measuring power consumption, the analog RF signals and digital logic signals lie within different measurement domains, i.e. the power domain, the analog domain and the digital domain, respectively.

SUMMARY

Thus, there is a need for a Multi-Domain Measurement System as well as a use of such a system.

To address this need, among others, the present disclosure provides a Multi-Domain Measurement System having:
  an oscilloscope unit and a power probe unit,
  said oscilloscope unit comprising
    at least one analog input channel for receiving a measured analog signal, and
    a first digital interface for receiving digitized measurement values from said power probe unit,
  said power probe unit being connected to said first digital interface for providing digitized measurements of a power supply signal,
  said power probe unit and said at least one analog input channel being adapted to be assigned to a device under test for simultaneously measuring signals in different domains of said device under test, and
  said power probe unit having at least one power probe measurement channel providing a vertical digitizing resolution that is at least two times higher than a vertical digitizing resolution of said at least one analog input channel.

The assignment of the power probe unit and said at least one analog input channel can be done by connecting the power probe unit and the analog input channel to the device under test wirelessly, e.g. by radio frequency transmission, by cable, by direct contact or the like. However, a cable connection may also be used.

The Multi-Domain Measurement System allows detecting and displaying the power consumption as well as a transmitted analog signal, i.e. a radio frequency signal like Bluetooth, with the same oscilloscope unit in order to correlate peaks of power consumption with events in the analog signal. This way, optimization and debugging may already be performed during hardware design. Because a single oscilloscope unit can be used for the measurements and because the power probe measurement channel has a high vertical digitizing resolution, precise and synchronous measurements are possible.

The vertical digitizing resolution of the power probe measurement channel may be 18 bit, being approximately a 100 dB dynamic range, leading to a high precision measurement of the power or energy consumption.

The terms "power consumption" and "energy consumption" are used synonymously in this disclosure.

For example, said vertical resolution of such power probe measurement channel is at least four times higher than said vertical digitizing resolution of said at least one analog input channel to even further improve measurement precision of the power consumption.

In an aspect of the disclosure, said power supply signal is at least one of a power signal, a low frequency power signal, a current signal, a battery current signal, a voltage signal, and a battery voltage signal in order for a precise and complete measurement of the energy or power consumption of the device under test. Particularly, a wide range of different signals can be measured appropriately.

In one embodiment of the disclosure, said Multi-Domain Measurement System comprises a logic probe unit and said oscilloscope unit comprises a second digital interface for receiving digitized measurement values from the logic probe unit, and said logic probe unit being connected to said second digital interface for providing digitized measurement values of a logic signal. Said logic probe unit being adapted to be assigned to said device under test for simultaneously measuring signals in the digital domain of said device under test. In this way, the power consumption of the device under test can additionally be correlated with digital transmissions like protocol transmissions allowing further optimization of the power consumption of the device under test.

The logic signal may comprise one of a digital signal, a bus signal and a protocol in order to correlate details of such signals transmitted with the power consumption of the device under test.

In an aspect of the disclosure, said domains comprise at least one of a low frequency voltage signal, a battery voltage, a battery current, a digital signal, a bus signal, a protocol, a broadband analog signal, and a transmitted radio frequency signal. Thus, measurements can be performed in the analog domain and/or the digital domain simultaneously to measurements in the power domain.

For example, said measured analog signal comprises at least one of a broadband analog signal and a transmitted radio frequency signal in order to correlate the power consumption to analog signals created by the device under test.

In another aspect of the disclosure, said oscilloscope unit comprises a synchronization member configured to synchronise said digitized measurement values of said power supply signal and at least one of said digitized measurement values of said logic signal and said measured analog signal to allow a very precise correlation of power consumption and the corresponding signal. At least one of calibration signal(s) and clock signal(s) is/are used for synchronization purposes.

For very high accuracy of the synchronization, i.e. nanosecond accuracy, said oscilloscope unit comprises a compensation member configured to compensate transit times of said power supply signal and of at least one of said logic signal and said analog signal.

For example, said oscilloscope unit comprises a processing member configured to align said digitized measurement values of said power supply signal and at least one of said digitized measurement values of said logic signal and said measured analog signal to a common horizontal axis facilitating the power consumption optimization. The common horizontal axis may be the time axis of a graph illustrated on a display of the Multi-Domain Measurement System. Accordingly, the processing member processes the respective data such that their graphic representatives are aligned to the common horizontal axis displayed.

For processing and displaying the measured values, said oscilloscope unit comprises a memory for storing said aligned digitized measurement values of said power supply signal and said at least one of said digitized measurement values of said logic signal and said measured analog signal. For example, the memory is a display memory. The contents of the display memory may be displayed on a display of the oscilloscope unit. Thus, the graphic representatives are stored in the display memory.

In another aspect of the disclosure, said oscilloscope unit comprises a trigger sub unit being adapted to selectively trigger on at least one of said logic signal, said power supply signal, and said measured analog signal to facilitate data analysis.

Particularly, the trigger sub unit is adapted to trigger on said logic signal provided that the Multi-Domain Measurement System comprises a logic probe unit for sensing the logic signal of the device under test.

In order to further improve measurement precision, at least one of said first digital interface and said second digital interface provides a control signal for controlling said power probe unit and said logic probe unit, respectively, and a power supply voltage for supplying said power probe unit and said logic probe unit, respectively. Therefore, the Multi-Domain Measurement System can control the probe units appropriately during the measurements. Thus, testing scenarios may be applied that comprise different measurements in a successive manner.

In another embodiment of the disclosure, said control signal includes at least one of a calibration signal and a clock signal for synchronizing said power probe unit and said logic probe unit, respectively. This way, the measurement of the probes can be synchronized in order to further improve the correlation of the measurements.

Hence, the synchronization member may be assigned to at least one of said first digital interface and said second digital interface.

In another aspect of the disclosure, said analog input channel and at least one of said power probe unit and said logic probe unit each has a sample rate, said sample rate of at least one of said power probe unit and said sample rate of said at least one of said logic probe unit being adapted to the sample rate of said analog input channel by interpolation to allow precise synchronization.

For a precise and reliable measurement of the analog signal of the device under test, said Multi-Domain Measurement System may comprise an antenna connected to said analog input channel to measure said radio frequency signals of said device under test.

The disclosure further provides a use of a Multi-Domain Measurement System to identify at least one of a transmit cycle and receive cycle of a device under test based on a measurement of at least one of power, current, and voltage at at least one of a power supply and a power amplifier supply of said device under test. The Multi-Domain Measurement System has an oscilloscope unit and a power probe unit. Said oscilloscope unit comprises at least one analog input channel for receiving a measured analog signal and a first digital interface for receiving digitized measurement values from said power probe unit. Said power probe unit is connected to said first digital interface for providing digitized measurements of a power supply signal, said power probe unit and said at least one analog input channel being adapted to be assigned to a device under test for simultaneously measuring signals in different domains of said device under test. This way, transmit cycles and receive cycles of devices may be recognized with respect to their power consumption. Once the respective transmit cycle and/or receive cycle is identified, the device under test can be optimized with regard to its power consumption.

Further, the disclosure provides a use of a Multi-Domain Measurement System to estimate power consumption of a device under test while said device under test performs at least one of a predefined logic signal transmission and a predefined analog signal transmission. The Multi-Domain Measurement System has an oscilloscope unit, a power probe unit, and at least one of a logic probe unit and an analog input channel of said oscilloscope unit. Said oscilloscope unit comprises a first digital interface for receiving digitized measurement values from said power probe unit and at least one of said analog input channel for receiving a measured analog signal and a second digital interface for receiving digitized measurement values from said logic probe unit connected to said second digital interface. Said power probe unit is connected to said first digital interface for providing digitized measurement values of a power supply signal. Said power probe unit and at least one of said logic probe unit and said at least one analog input channel being adapted to be assigned to a device under test for simultaneously measuring signals in different domains of said device under test. Estimation of power consumption is done by correlating said signal measured by said power probe unit with at least one of said signal measured by said logic probe unit and said signal received by said analog input channel. This allows optimization of the power consumption generated by transmission of the logic and/or analog signal of the device under test.

Further, said power probe unit may have at least one power probe measurement channel providing a vertical digitizing resolution that is at least two times, in particular four times, higher than a vertical digitizing resolution of said at least one analog input channel.

DESCRIPTION OF THE DRAWINGS

The foregoing aspect and many of the attendant advantages of the claimed subject-matter will become more readily appreciated as the same become better understood by reference to the following detailed description, when taking in conjunction with the accompanying drawings, wherein:

DETAILED DESCRIPTION

Figure 1:
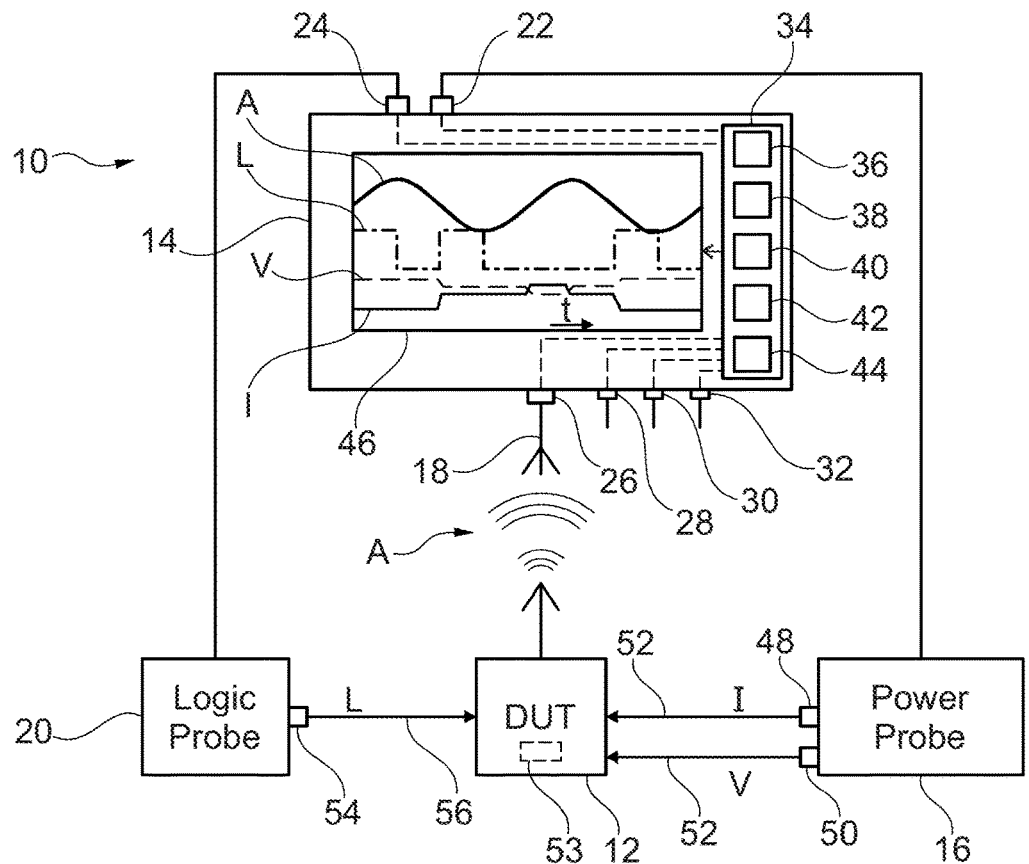
FIG. 1 shows a schematic overview of a Multi-Domain Measurement System according to the disclosure and a device under test.

FIG. 1 shows schematically a Multi-Domain Measurement System 10 and a device under test 12 (DUT) in which at least one measurement is performed by the Multi-Domain Measurement System 10.

The device under test 12 may be a radio-frequency module (RF-module) or a data processing chip set used in devices in which energy or power consumption is critical.

The terms "energy consumption" and "power consumption" are used synonymously throughout this disclosure.

The Multi-Domain Measurement System 10 comprises an oscilloscope unit 14, a power probe unit 16, an antenna 18, and a logic probe unit 20.

The oscilloscope unit 14 comprises a first digital interface 22 and a second digital interface 24, as well as four analog input channels 26, 28, 30, 32.

The oscilloscope unit 14 further comprises a control unit 34 connected to the first digital interface 22, the second digital interface 24, and the analog input channels 26, 28, 30, 32.

The control unit 34 has a synchronization member 36, a compensation member 38 that may be part of the synchronization member 36, a processing member 40, and a trigger sub unit 42.

Each of the members 36, 38, 40 and the trigger sub unit 42 may be separate from or integrated with the other members or sub units of the control unit 34.

The oscilloscope unit 14 may further comprise a display memory 44 that could also be part of the control unit 34 and a display 46 for displaying graphical representations of data.

In the set-up shown in the exemplary embodiment of FIG. 1, the antenna 18 is connected to the first analog input channel 26.

The antenna 18 is assigned to the device under test 12 meaning that the antenna 18 is aligned with respect to the device under test 12 such that it receives radio frequency transmissions by the device under test 12.

Thus, the antenna 18 detects an analog Signal A of the device under test 12, in this example a transmitted radio frequency signal and provides the analog signal A to the analog input channel 26.

It is also possible, however, that the measured analog signal is measured without an antenna but using a physical connection like a cable, probe or the like. In this case, the analog signal A might be a broadband analog signal.

The analog input channel 26, more precisely the analog-to-digital converter associated with the analog input channel 26 has a vertical digitizing resolution.

The power probe unit 16 is connected to the first digital interface 22, for example by a suitable cable.

The power probe unit 16 comprises at least one power probe measurement channel, in the shown embodiment two power probe measurement channels 48 and 50.

Each of the power probe measurement channels 48, 50 is equipped with a power probe 52 physically contacting the device under test 12.

The power probe measurement channels 48, 50, more precisely their associated analog-to-digital converters, have a vertical digitizing resolution being at least two times the vertical digitizing resolution of the analog input channel 26, for example of at least four times the vertical digitizing resolution of the analog input channel 26. The vertical digitizing resolution of the power probe measurement channels 48, 50 may be 18 bit leading to a dynamic range of approximately 100 dB.

The power probe 52 may be connected close to a power supply or a power amplifier supply 53 of the device under test 12 and configured to measure a power supply signal, in the shown example consisting of the current I and the voltage V of the power supply or the power amplifier supply. It is also possible to measure the power at these locations.

Thus, the power probe unit 16 is configured to measure a power supply signal being a power signal, e.g. a low-frequency power signal; a current signal, e.g. a battery current signal; or a voltage signal, e.g. a battery voltage signal of the device under test 12.

The power probe unit 16—more precisely the analog-to-digital converter of the power probe measurement channels 48, 50—creates digitized measurement values of the power supply signal I, V and provides the digitized measurement values to the first digital interface 22 of the oscilloscope unit 14.

The logic probe unit 20 is connected to the second digital interface 24. The logic probe unit 20 comprises a logic probe measurement channel 54 and a logic probe 56 being connected to the logic probe measurement channel 54.

The logic probe measurement channel 54, more precisely its associated analog-digital-converter may also have a vertical digitizing resolution that may be in the order of magnitude of the vertical digitizing resolution of the power probe measurement channel 50 or in the order of magnitude of the vertical digitizing resolution of the analog input channel 26.

The logic probe 56 may be in physical contact with logic transmission lines (not shown) of the device under test 12 in order to measure a logic signal L. The logic signal L may be a digital signal, a bus signal or a protocol.

The logic probe unit 20, more precisely its associated analog-to-digital converter, digitizes the logic signal L and provides the digitized measurement values of the logic signal L to the second digital interface 24 of the oscilloscope unit 14.

Both, the power probe unit 16 and the logic probe unit 20 may receive a control signal from the control unit 34 provided by the first digital interface 22 and the second digital interface 24.

The control signal includes, for example, a calibration signal for the power probes 52 or the logic probe 56 and may also include a clock signal for synchronizing the measurements of the power probe unit 16 and the logic probe unit 20.

Further, the first digital interface 22 and the second digital interface 24 may provide a power supply voltage for supplying energy to the power probe unit 16 and the logic probe unit 20, respectively. Accordingly, the operating state of the probe units 16, 20 can be controlled by the oscilloscope unit 14 such that measurement scenarios can be performed that comprise different measurements in a successive manner.

In addition, one or both of the power probe unit 16 and the logic probe unit 20 has/have a sample rate, wherein the analog input channel 26 also has a sample rate that may differ from the sample rate of the power probe unit 16 and the logic probe unit 20.

For precise measurements, the sampling rates have to be adapted to each other. Particularly, the sample rates of the probe units 16, 20 are adapted to the one of the analog input channel 26. This adaption may be performed by interpolating measurement values that lie between two sampling points if a higher sample rate is needed for the power probe unit 16 and/or the logic probe unit 20.

However, the sample rate of the analog input channel 26 can also be adapted correspondingly by interpolating measurement values.

In total, the oscilloscope unit 14 is provided with signals from different domains. Measurement values in the analog domain are provided by the antenna 18 and the analog input channel 26; measurements in the digital domain are provided by the logic probe unit 20 via the second digital interface 24; and signals from the power domain are provided by the power probe unit 16 via the first digital interface 22.

Therefore, the domains, i.e. the measured signals of the different domains, may comprise a low frequency power signal, a battery voltage, a battery current, a digital signal, a bus signal, a protocol, a broadband analog signal, and a transmitted radio frequency signal.

For performing a measurement on the device under test 12, the measurements in the different domains, i.e. the analog measurement, the digital measurement, and the power measurement, are performed simultaneously.

In order to correlate the power consumption to a specific radiofrequency transmission or logic transmission, the device under test 12 is made to perform a predefined specific radiofrequency transmission or logic transmission. The measurements are taken while the device under test 12 performs the predefined radiofrequency transmission or logic transmission.

The digitized measurement values of the power supply signal and the logic signal as well as the measurement values of the measured analog signal are fed to the control unit 34.

The synchronization member 36 of the control unit synchronizes these digitized measurement values. This may be done via the compensation member 38 by compensating the transit times of the three signals. By compensating the transit times, nanosecond accuracy can be achieved.

To support the synchronization member 36 and the compensation member 38, the measurements can be synchronized using the control signal sent to the power probe unit 16 and the logic probe unit 20.

After synchronization, the processing member 40 aligns the digitized measurement values of the power supply signal I, V, the logic signal L and the analog signal A to a common horizontal axis that is, in the shown example, the time axis.

The result of the alignment, in particular the graphic representative(s) of the corresponding data, is stored in the display memory 44 and displayed using the display 46.

For precise analysis of certain events, the trigger sub unit 42 can be used to trigger any value on either the power supply signal I, V, the logic signal L and the analog signal A.

Figure 2:
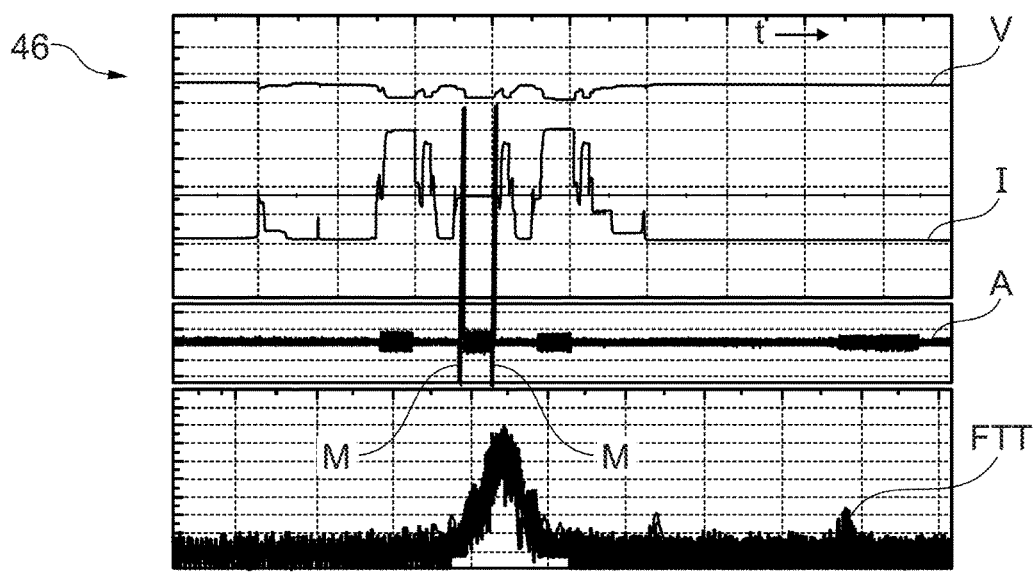
FIG. 2 shows schematically a measurement result of the Multi-Domain Measurement System according to FIG. 1.

FIG. 2 shows the display 46 of the oscilloscope unit 14 during a measurement.

In this situation, the power supply signal comprises a voltage signal V and a current signal I being the first and second graph from the top on the display 46, respectively.

The measured analog signal A is shown as the third graph from top. Further, in this example, a Fast Fourier Transform FTT of the analog signal A is shown near the bottom of the display 46.

In FIG. 2, two vertical markers M highlight a period in time in which an analog signal A has been measured that correlates to a radio frequency signal radiated by the device under test 12.

It can be seen in the power supply signals I, V that the power consumption of the device under test 12 during this transmission of the radio frequency electromagnetic waves is increased drastically because of a drastic increase of the current signal I.

Thus, the power consumption of the device under test 12 during a transmit cycle can be estimated based on the power supply signal I, V provided by the power probe unit 16.

For measuring the power consumption during a receive cycle of the device under test 12, the antenna 18 may be driven by the oscilloscope unit 14 to emit radio frequency electromagnetic waves that are received by the device under test 12. In this case, the analog signal A is replaced by the driving signal of the antenna 18.

In FIG. 2, the logic signal has been omitted for the sake of simplicity.

Of course, it is also possible to analyze and display the logic signal L in conjunction with the power supply signal I, V in order to correlate logic transmission by the device under test with the power consumption.

Furthermore, the logic signal L, the analog signal A and the power supply signal I, V may be correlated simultaneously.

The use of said Multi-Domain Measurement System 10 ensures that transmit and/or receive cycle(s) can be identified easily based on the power supply signal that may be provided by the power supply of the device under test 12 or its power amplifier supply 53.

Moreover, the use of said Multi-Domain Measurement System 10 ensures that the power consumption of the device under test 12 can be estimated provided that the device under test 12 performs a predefined transmission of at least one of a logic signal L or an analog signal A.

The invention claimed is:

1. A Multi-Domain Measurement System having:
   an oscilloscope unit and a power probe unit,
   said oscilloscope unit comprising
      at least one analog input channel for receiving a measured analog signal, and
      a first digital interface for receiving digitized measurement values from said power probe unit, and
      an antenna connected to said analog input channel for measuring a radiofrequency signal of said device under test;
   said power probe unit being connected to said first digital interface for providing digitized measurements of a power supply signal,
   said power probe unit and said at least one analog input channel being adapted to be assigned to a device under test for simultaneously measuring signals in different domains of said device under test, and
   said power probe unit having at least one power probe measurement channel providing a vertical digitizing resolution that is at least two times higher than a vertical digitizing resolution of said at least one analog input channel.

2. The Multi-Domain Measurement System according to claim 1, wherein said vertical resolution of said power probe measurement channel is at least four times higher than said vertical digitizing resolution of said at least one analog input channel.

3. The Multi-Domain Measurement System according to claim 1, wherein said power supply signal is at least one of a power signal, a low frequency power signal, a current signal, a battery current signal, a voltage signal, and a battery voltage signal.

4. The Multi-Domain Measurement System according to claim 1, wherein said Multi-Domain Measurement System comprises a logic probe unit and said oscilloscope unit comprises a second digital interface for receiving digitized measurement values from said logic probe unit, and said logic probe unit being connected to said second digital interface for providing digitized measurement values of a logic signal,
   said logic probe unit being adapted to be assigned to said device under test for simultaneously measuring signals in the digital domain of said device under test.

5. The Multi-Domain Measurement System according to claim 4, wherein said logic signal comprises at least one of a digital signal, a bus signal, and a protocol.

6. The Multi-Domain Measurement System according to claim 1, wherein said domains comprise at least one of a low frequency power signal, a battery voltage, a battery current, a digital signal, a bus signal, a protocol, a broadband analog signal, and a transmitted radio-frequency signal.

7. The Multi-Domain Measurement System according to claim 1, wherein said measured analog signal comprises at least one of a broadband analog signal and a transmitted radio-frequency signal.

8. The Multi-Domain Measurement System according to claim 1, wherein said oscilloscope unit comprises a synchronization member configured to synchronize said digitized measurement values of said power supply signal and at least one of said digitized measurement values of said logic signal and said measured analog signal.

9. The Multi-Domain Measurement System according to claim 1, wherein said oscilloscope unit comprises a compensation member configured to compensate transit times of said power supply signal and of at least one of said logic signal and said analog signal.

10. The Multi-Domain Measurement System according to claim 1, wherein said oscilloscope unit comprises a processing member configured to align said digitized measurement values of said power supply signal and at least one of said digitized measurement values of said logic signal and said measured analog signal to a common horizontal axis.

11. The Multi-Domain Measurement System according to claim 10, wherein said oscilloscope unit comprises a memory for storing said aligned digitized measurement values of said power supply signal and said at least one of said digitized measurement values of said logic signal and said measured analog signal.

12. The Multi-Domain Measurement System according to claim 1, wherein said oscilloscope unit comprises a trigger sub unit being adapted to selectively trigger on at least one of said logic signal, said power supply signal and said measured analog signal.

13. The Multi-Domain Measurement System according to claim 1, wherein at least one of said first digital interface and said second digital interface provides a control signal for controlling said power probe unit and said logic probe unit, respectively, and a power supply voltage for supplying said power probe unit and said logic probe unit, respectively.

14. The Multi-Domain Measurement System according to claim 13, wherein said control signal includes at least one of a calibration signal and a clock signal for synchronizing said power probe unit and said logic probe unit, respectively.

15. The Multi-Domain Measurement System according to claim 1, wherein said analog input channel and at least one of said power probe unit and said logic probe unit each has a sample rate, said sample rate of at least one of said power probe unit and said sample rate of said at least one of said logic probe unit being adapted to the sample rate of said analog input channel by interpolation.

16. A use of a Multi-Domain Measurement System to identify at least one of a transmit cycle and a receive cycle of a device under test based on a measurement of at least one of power, current, and voltage at least one of a power supply and a power amplifier supply of said device under test, the Multi-Domain Measurement System having:
an oscilloscope unit and a power probe unit,
said oscilloscope unit comprising
at least one analog input channel for receiving a measured analog signal, and
a first digital interface for receiving digitized measurement values from said power probe unit, and
an antenna connected to said analog input channel for measuring a radiofrequency signal of said device under test;
said power probe unit being connected to said first digital interface for providing digitized measurements of a power supply signal,
said power probe unit and said at least one analog input channel being adapted to be assigned to a device under test for simultaneously measuring signals in different domains of said device under test, and
said power probe unit having at least one power probe measurement channel providing a vertical digitizing resolution that is at least two times higher than a vertical digitizing resolution of said at least one analog input channel.

17. A use of a Multi-Domain Measurement System to estimate power consumption of a device under test while said device under test performs at least one of a predefined logic signal transmission and a predefined analog signal transmission, said Multi-Domain Measurement System having:
an oscilloscope unit, a power probe unit, and at least one of a logic probe unit and an analog input channel of said oscilloscope unit,
said oscilloscope unit comprising
a first digital interface for receiving digitized measurement values from said power probe unit, and
at least one of said analog input channel for receiving a measured analog signal and a second digital interface for receiving digitized measurement values from said logic probe unit connected to said second digital interface;
said power probe unit being connected to said first digital interface for providing digitized measurement values of a power supply signal, and
said power probe unit and at least one of said logic probe unit and said at least one analog input channel being adapted to be assigned to a device under test for simultaneously measuring signals in different domains of said device under test;
wherein estimation of power consumption is done by correlating said signal measured by said power probe unit with at least one of said signal measured by said logic probe unit and said signal received by said analog input channel.

18. The use according to claim 17, wherein said power probe unit having at least one power probe measurement channel providing a vertical digitizing resolution that is at least two times higher than a vertical digitizing resolution of said at least one analog input channel.

19. A Multi-Domain Measurement System having:
an oscilloscope unit and a power probe unit,
said oscilloscope unit comprising
at least one analog input channel for receiving a measured analog signal, and
a first digital interface for receiving digitized measurement values from said power probe unit, and
an antenna connected to said analog input channel for measuring a radiofrequency signal of said device under test;
said power probe unit being connected to said first digital interface for providing digitized measurements of a power supply signal,
said power probe unit and said at least one analog input channel being adapted to be assigned to a device under test for simultaneously measuring signals in different domains of said device under test, and
said power probe unit having at least one power probe measurement channel providing a vertical digitizing resolution that is at least two times higher than a vertical digitizing resolution of said at least one analog input channel, wherein the vertical digitizing resolution is at least 18 bits leading to a dynamic range of approximately 100 db.

\* \* \* \* \*